(54) MODULAR DATA MEDIUM

(75) Inventors: Thomas Tarantino, Laufen (DE); Yahya Haghiri-Tehrani, Munich (DE)

(73) Assignee: Giesecke & Devrient GmbH, Munich (DE)

( * ) Notice: Subject to any disclaimer, the term of this patent is extended or adjusted under 35 U.S.C. 154(b) by 0 days.

(21) Appl. No.: 09/355,328

(22) PCT Filed: Feb. 2, 1998

(86) PCT No.: PCT/EP98/00549

§ 371 (c)(1),
(2), (4) Date: Oct. 18, 1999

(87) PCT Pub. No.: WO98/34194

PCT Pub. Date: Aug. 6, 1998

(30) Foreign Application Priority Data

Feb. 3, 1997 (DE) .......................................... 197 03 990

(51) Int. Cl.[7] .............................................. G06K 19/06
(52) U.S. Cl. .......................... 235/492; 235/486; 235/487
(58) Field of Search ................................ 235/492, 486, 235/488, 441, 451

(56) References Cited

U.S. PATENT DOCUMENTS

| | | | |
|---|---|---|---|
| 4,727,246 A | * 2/1988 | Hara et al. | 235/492 X |
| 4,790,697 A | * 12/1988 | Hines et al. | 408/2 |
| 4,990,759 A | * 2/1991 | Gloton et al. | 235/492 |
| 5,013,900 A | * 5/1991 | Hoppe | 235/492 |
| 5,027,190 A | * 6/1991 | Haghiri-Tehrani et al. | 235/492 X |
| 5,055,913 A | * 10/1991 | Haghiri-Tehrani | 235/492 X |
| 5,057,679 A | * 10/1991 | Audic et al. | 235/492 |
| 5,208,450 A | * 5/1993 | Uenishi et al. | 235/492 |
| 5,438,750 A | * 8/1995 | Venambre | 235/492 X |
| 5,519,201 A | * 5/1996 | Templeton, Jr. et al. | 235/492 |
| 5,598,032 A | * 1/1997 | Fidalgo | 235/492 X |
| 5,612,532 A | * 3/1997 | Iwasaki | 235/492 |
| 5,637,858 A | * 6/1997 | Hoppe et al. | 235/492 |
| 5,671,525 A | * 9/1997 | Fidalgo | 235/492 X |

FOREIGN PATENT DOCUMENTS

FR  2-702-067 A1  * 4/1996
JP  0-635-801 A2  * 1/1995

* cited by examiner

*Primary Examiner*—Karl D. Frech
*Assistant Examiner*—Daniel Walsh
(74) *Attorney, Agent, or Firm*—Bacon & Thomas, PLLC

(57) ABSTRACT

The invention relates to a card-shaped data carrier comprising a card body (1) having an antenna (3), and a chip module (2) containing an integrated circuit (10) and inserted into a gap (5) in the card body (1). The electric connection between the antenna (3) and the chip module (2) is effected via depressions (11) in the terminals (4) of the antenna (3). For producing the inventive data carrier one provides the card body (1), in which the antenna (3) is at least partly embedded, with a gap (5). The terminals (4) of the antenna (3) are exposed by removing the superjacent card material whereby part of the material forming the terminals (4) is also removed. The chip module (2) is inserted into the gap (5) and for example glued to the card body (1) with a thermally activable adhesive (6), an electric connection being formed between the chip module (2) and the antenna (3) for example by means of a conductive adhesive (7) previously applied to the exposed terminals (4) of the antenna (3). In the preferred embodiment the material removal on the terminals (4) of the antenna (3) is effected such that a bevel arises.

19 Claims, 5 Drawing Sheets

MODULAR DATA MEDIUM

BACKGROUND OF THE INVENTION

1. Field of the Invention

This invention relates to a card-shaped data carrier comprising a card body with an antenna, and a chip module with an integrated circuit connected electrically with the antenna.

2. Related Art

Such a data carrier can be formed as a credit card, bank card, electronic purse, etc., and used for contactless completion of transactions, for example for paying a charge for short-distance passenger transport or paying a purchasing price for goods or services. Further, such a data carrier can be used as an identity card for noncontacting admission control. In this case an identification code is stored in the integrated circuit for enabling admittance to a closed-off area in a building.

DE 44 16 697 A1 discloses a number of variants for constructing and producing such a data carrier. It discloses inter alia a card body having a coil and a gap for receiving a chip module. The chip module is inserted into the gap in such a way as to form an electric connection between the integrated circuit of the chip module and the coil contained in the card body. No details are to be found in DE 44 16 697 A1 on the production of the gap and in particular the exposure of the coil terminals.

It is commonly known to produce a gap for mounting a chip module in a card body, for example with the aid of a suitable milling tool. With known techniques, however, no measures are provided to ensure that the terminals of an antenna integrated in the card body are exposed with sufficient precision and reliability. Contacting problems can therefore occur upon incorporation of the chip module.

BRIEF SUMMARY OF THE DISCLOSURE

The invention is based on the problem of forming a reliable electric connection in a card-shaped data carrier between a chip module and an antenna disposed in the card body.

The basic idea of the invention is to effect material removal on the terminals of the antenna when exposing said terminals as is necessary for contacting the antenna.

This procedure has the advantage that any layers of dirt or oxide present on the terminals are removed by the material removal, thereby creating optimum preconditions for a reliable electric connection between the terminals of the antenna and the integrated circuit of the chip module.

A further advantage of the invention is that a greater tolerance range is permissible for exposure of the antenna terminals if one includes material removal on the terminals, compared with exact exposure of the surface of the terminals. If the antenna terminals are localized very exactly in the card body, a tolerance in the order of magnitude of half the terminal thickness is readily permissible on the basis of the inventive method when exposing the antenna terminals.

In the preferred embodiment one effects the material removal necessary for exposing the antenna terminals by beveling the terminals. In this way one can considerably enlarge the permissible tolerance range since sufficient material for contacting the integrated circuit of the chip module is left with a bevel of the terminals over a relatively large feed area of the material-removing tool. This might at most shift the lateral place of contacting, which causes no great problems. A further advantage of the bevel is that a larger terminal area is available for contacting so that a reliable contact can be formed.

It is also especially advantageous to ascertain by means of a sensor signal when material removal on the antenna terminals begins. This sensor signal can be used for feed control of the material-removing tool, which can be controlled very exactly in this way, independently of the production-related dispersion of the position of the antenna terminals in the card body.

DESCRIPTION OF THE DRAWING

Advantageous and expedient embodiments and developments of the invention will be shown in the following.

DETAILED DESCRIPTION

Figure 1:
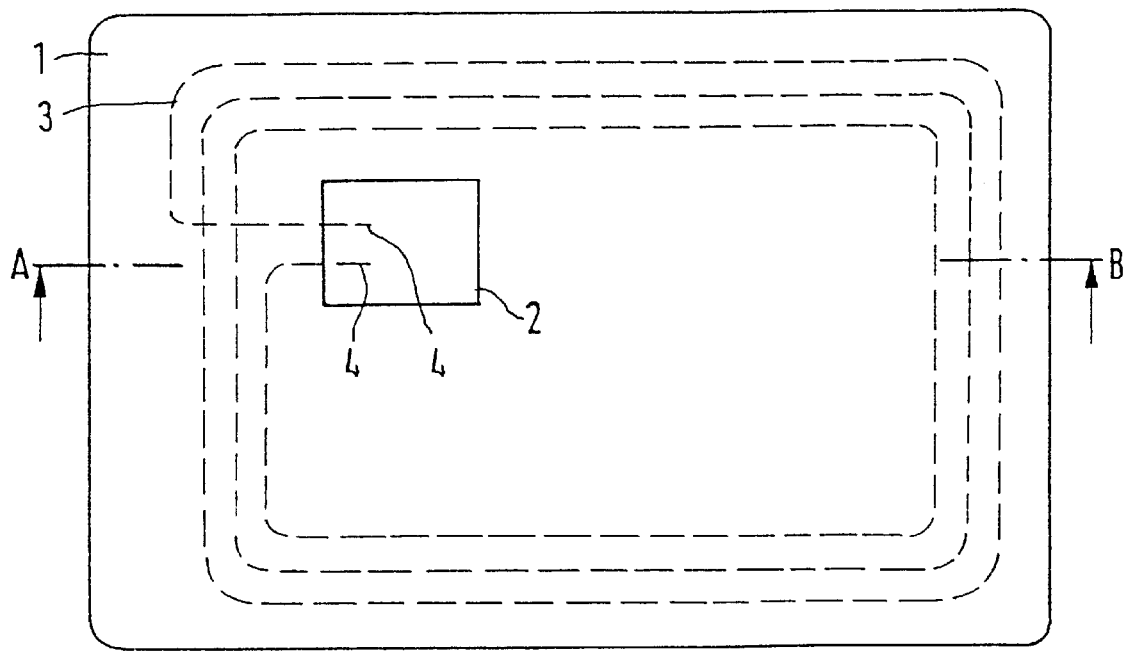
FIG. 1 shows the inventive data carrier in a plan view.

FIG. 1 shows the inventive data carrier in a plan view. The data carrier is a chip card according to the ISO standard. Card body 1 of said chip card contains coil element 3 serving as a transmit and receive antenna for an integrated circuit (not shown in the drawing) of chip module 2. In the embodiment shown in FIG. 1, coil element 3 is embedded completely in the card body and therefore invisible from outside. To illustrate the position of coil element 3 in the card body, coil element 3 is shown schematically by a dashed line in FIG. 1. Chip module 2 is inserted in a gap in card body 1 and connected with coil element 3 via terminals 4. Instead of coil element 3 one can also provide a capacitive coupling area or another transmission link as an antenna.

Figure 2:
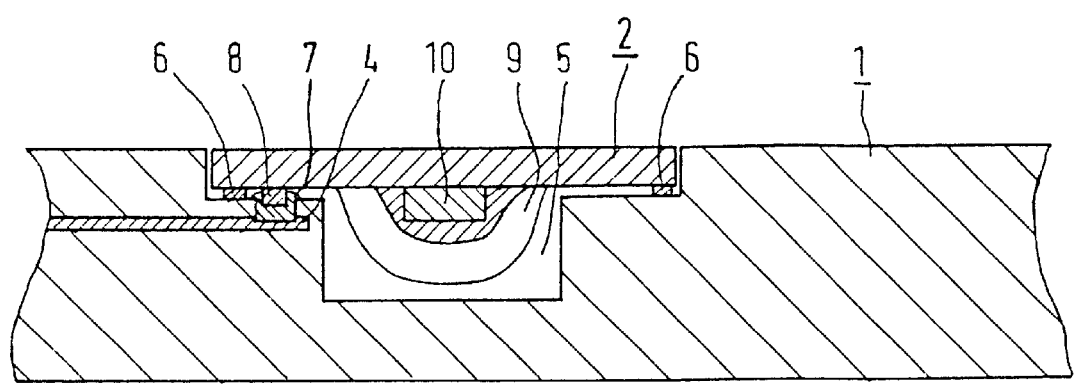
FIG. 2 shows a sectional view of the data carrier shown in FIG. 1.

FIG. 2 shows a sectional view of the chip card shown in FIG. 1. The section was made along line A–B depicted in FIG. 1. For better illustration of the details of the invention FIG. 2 does not show the whole chip card but only an enlarged detail of the chip card. Chip module 2 is fitted into two-step gap 5 in card body 1 in such a way that the surface of chip module 2 is flush with the surface of card body 1 and contacts 8 of chip module 2 come to lie opposite exposed and partly removed terminals 4 of coil element 3. For this purpose gap 5 is dimensioned so as to be able to receive chip module 2 together with casting compound 9 surrounding integrated circuit 10. The mechanical connection between chip module 2 and card body 1 can be formed for example with the aid of thermally activable adhesive 6. The electric connection between chip module 2 and coil element 3 contained in card body 1 can be effected by means of conductive adhesive 7 applied to terminals 4 of coil element 3 or to contacts 8 of chip module 2. Conductive adhesive 7 can simultaneously perform the function of mechanically connecting chip module 2 and card body 1 so that one can dispense with thermally activable adhesive 6 in this case.

Figure 3:
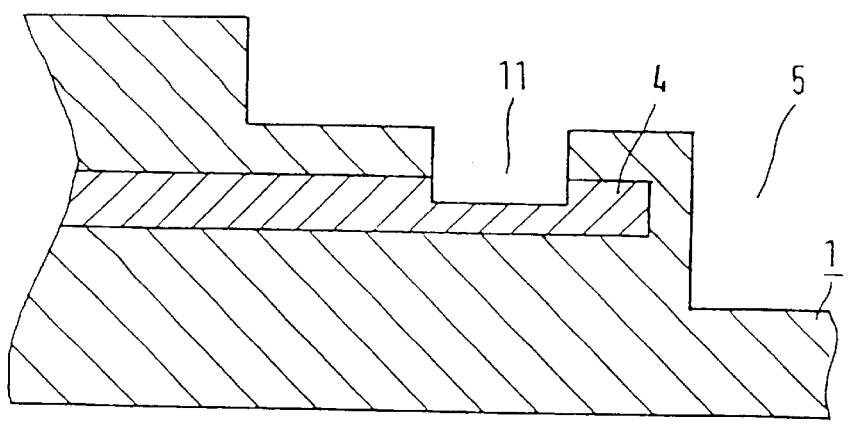
FIGS. 3 to 5 each show an enlarged detail of the inventive data carrier in a sectional view to illustrate important steps of the production method.
Figure 4:
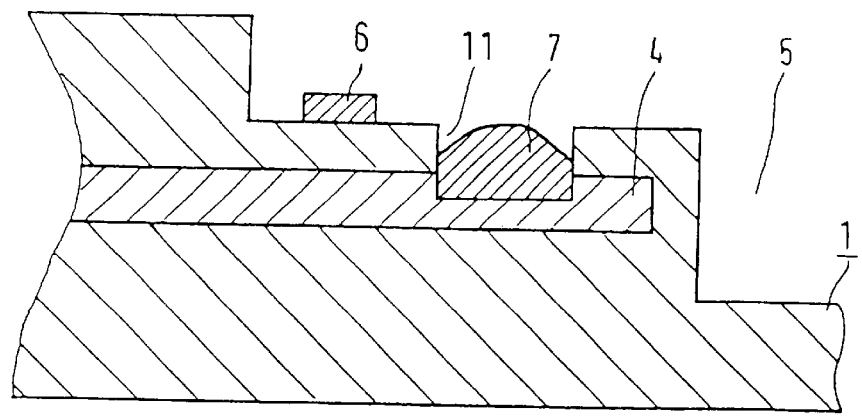
Figure 5:
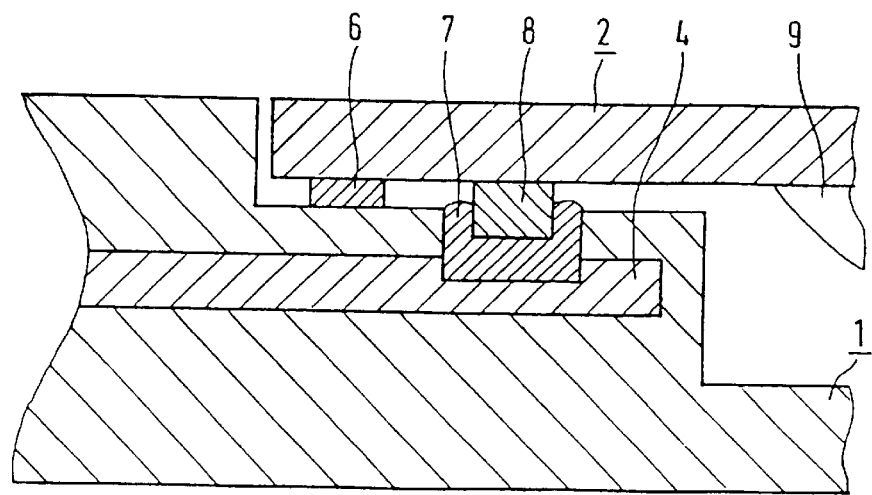

Important method steps of the inventive production method are shown in FIGS. 3, 4 and 5. These figures each show an enlarged detail of the chip card in a sectional view. The detail covers the close surroundings of one of terminals 4.

FIG. 3 shows the chip card after production of two-step gap 5 and exposure of terminal 4 of coil element 3. Terminal 4 of coil element 3 was exposed by incorporating depression 11 in two-step gap 5. Depression 11 extends into terminal 4 of coil element 3, i.e. not only card material was removed but also material on terminal 4 of coil element 3. Both two-step gap 5 and depression 11 can be produced by means of suitable milling tools. Depending on the special design of depression 11 one can also produce it using a combined milling tool or a single milling tool.

FIG. 4 shows how the chip card prepared according to FIG. 3 is provided with conductive adhesive 7 and thermally activable adhesive 6. This can be done either in a single method step or in separate method steps. For conductive adhesive 7 one can use a liquid adhesive for example. Conductive adhesive 7 is filled into depression 11. The exact metered quantity depends on the geometry of depression 11 and also on the geometry of contact 8 on chip module 2. Thus, depression 11 is normally filled only partly with conductive adhesive 7 if contact 8 of chip module 2 protrudes into depression 11. However, if contact 8 of chip module 2 only rests on the edges of depression 11 or contact 8 is recessed in chip module 2 without protruding into depression 11, it is necessary to meter accordingly more of conductive adhesive 7 so that it protrudes beyond the edge of the depression. It may be favorable in some cases to provide leveling cavities able to receive surplus conductive adhesive 7 displaced upon insertion of the chip module. Alternatively it is also possible to use conductive adhesive 7 executed as a thermally activable adhesive foil. This adhesive foil can in particular be constructed so as to be continuously conductive in directions perpendicular to its surface and only locally conductive in directions parallel to its surface. Such special foils are recommendable in particular if both the electric and the mechanical connection between chip module 2 and card body 1 are to be formed with one and the same adhesive foil. The directional conductivity of the adhesive foil then makes it possible to use a continuous piece of foil without terminals 4 of antenna 3 being short circuited.

Thermally activable adhesive 6 can for example be incorporated in the two-step gap in the form of an accordingly shaped foil. One could also use a liquid adhesive, or microencapsulated adhesives activated by destruction of the microcapsules. Thermally activable adhesive 6 can be provided both on card body 1—as shown in FIG. 4—and at a corresponding place on chip module 2. After application of conductive adhesive 7 and thermally activable adhesive 6, chip module 2 is inserted into two-step gap 5, as shown in FIG. 5.

FIG. 5 shows the chip card together with fitted chip module 2. The electric connection between chip module 2 and coil element 3 arises by contact 8 of chip module 2 being dipped into conductive adhesive 7 previously introduced into depression 11. The bottom of depression 11 as well as part of the wall are formed by terminal 4 of coil element 3 so that the electric connection with coil element 3 is formed in this way. Thermally activable adhesive 6 serves to produce or strengthen the mechanical fixation of chip module 2 on card body 1. The compound between card body 1 and chip module 2 by means of thermally activable adhesive 6 can be formed by inserting chip module 2 into two-step gap 5 in card body 1 using pressure and heat. Thermally activable adhesive 6 is thereby activated and unites with chip module 2 and card body 1 to form a lasting adhesive bond. It is likewise conceivable to select for conductive adhesive 7 a material which can be thermally activated, so that both the electric connection by means of conductive adhesive 7 and the mechanical connection by means of thermally activable adhesive 6 can be formed in the same method step.

Thermally activable adhesive 6 can also be dispensed with completely if an adhesive bond with sufficiently high mechanical strength can be produced by conductive adhesive 7 alone. In a variant it is also possible to provide only thermally activable adhesive 6 and omit conductive adhesive 7. For this purpose the geometry of contact 8 and depression 11 are coordinated with each other so that insertion of chip module 2 into two-step gap 5 and the accompanying gluing by means of thermally activable adhesive 6 lead to a lasting electric connection between contact 8 of chip module 2 and terminal 4 of coil element 3. Formation of the electric connection between contact 8 of chip module 2 and terminal 4 of coil element 3 can be supported by further measures, such as mechanical deformation, welding, soldering, bonding, etc.

Figure 6:
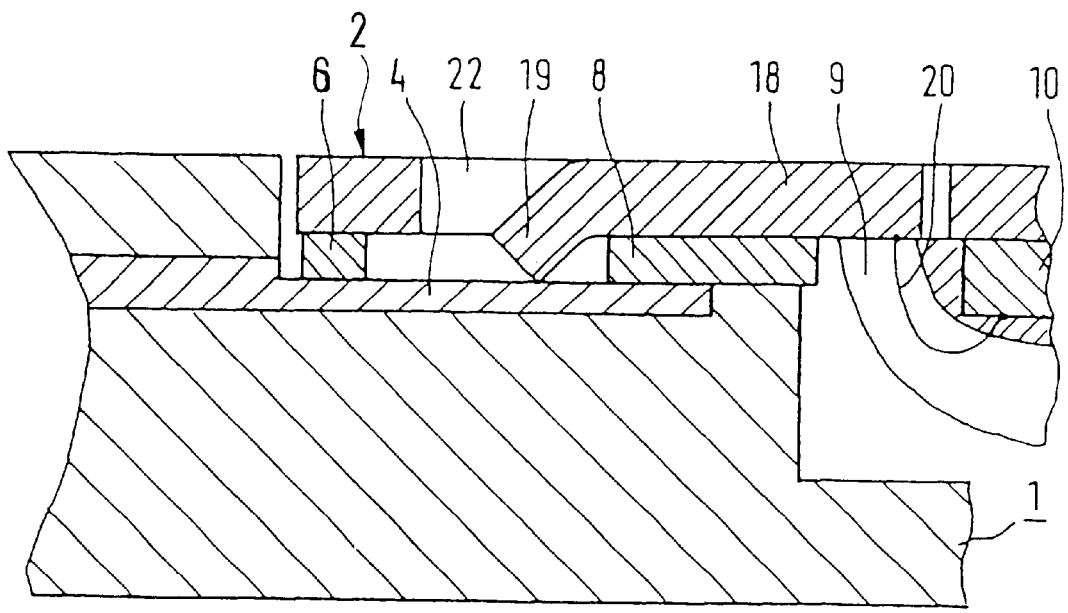
FIGS. 6, 7 show enlarged details of different embodiments of the inventive data carrier after insertion of the chip module in sectional views.

The electric connection between contact 8 of chip module 2 and terminal 4 of coil element 3 can also be formed without conductive adhesive 7 by mechanical touching of contact 6 and terminal 4. An embodiment for touch contacting is shown in FIG. 6. Touch contacting is especially well suited with the use of a lead frame module, i.e. chip module 2 consisting of integrated circuit 10 disposed in casting compound 9 and lead network 18. Lead network 18 is normally produced by punching a metal foil, the design of lead network 18 depending on whether chip module 2 is to communicate with the outside world in later operation contactlessly via coil element 3 contained in card body 1 or with contact via areas of lead network 18 formed as contact surfaces. In all cases one forms the electric connection between chip module 2 and coil element 3 by producing areas 19 projecting beyond the main surface of lead network 18, and openings 22, by embossing lead network 18 in some places, projecting areas 19 entering into mechanical and thus also electric contact with terminal 4 of coil element 3 after insertion of chip module 2 into card body 1. The extent of embossing can be adjusted such that a presettable pressure is exerted on terminal 4 of coil element 3 due to the spring action of projecting areas 19, so that reliable electric contacting between coil element 3 and integrated circuit 10 occurs even under mechanical stress, e.g. upon bending of the chip card.

In the case of chip module 2 which is also intended for contact operation, projecting areas 19 can be part of the contact surfaces intended for communication with the outside world. Said contact surfaces or projecting areas 19 of lead network 18 can be electrically connected with integrated circuit 10 via bonding wires 20 for example.

To form a mechanical connection between chip module 2 and card body 1 one can, as in the other embodiments, provide thermally activable adhesive 6 mounted for example in the form of an accordingly shaped foil on chip module 2 or in two step gap in card body 1. The incorporation of chip module 2 into card body 1 corresponds to the procedure in the embodiments described above.

Figure 7:
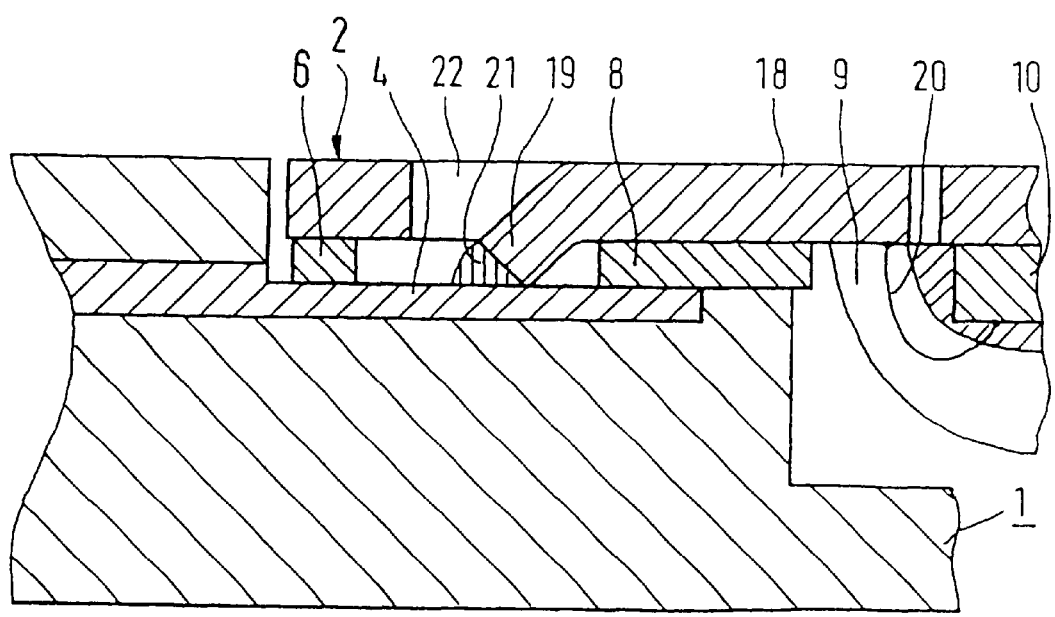

A further embodiment is shown in FIG. 7. This embodiment uses the lead frame module described above in FIG. 6. In the case of FIG. 7, however, the electric contact between projecting areas 19 of lead network 18 and terminal 4 of coil element 3 is not, or not only, formed by mechanical contact but by weld joint 21. Weld joint 21 can be produced for example by means of a laser beam irradiated through openings 22 in lead network 18 arising during embossing of areas 19.

Both in the embodiment according to FIG. 6 and in the embodiment according to FIG. 7, areas 19 of lead network 18 can also be embossed only upon insertion of chip module 2 into card body 1. This permits the adhesive bond between chip module 2 and card body 1 and the embossing of lead network 18 to be effected in one working step.

FIGS. 8 to 12 show further embodiments for the arrangement of terminals 4 of coil element 3 in card body 1 or the exposure of terminals 4. As in FIGS. 3 to 5, an enlarged detail of card body 1 is again shown in a sectional view in each case.

Figure 8:
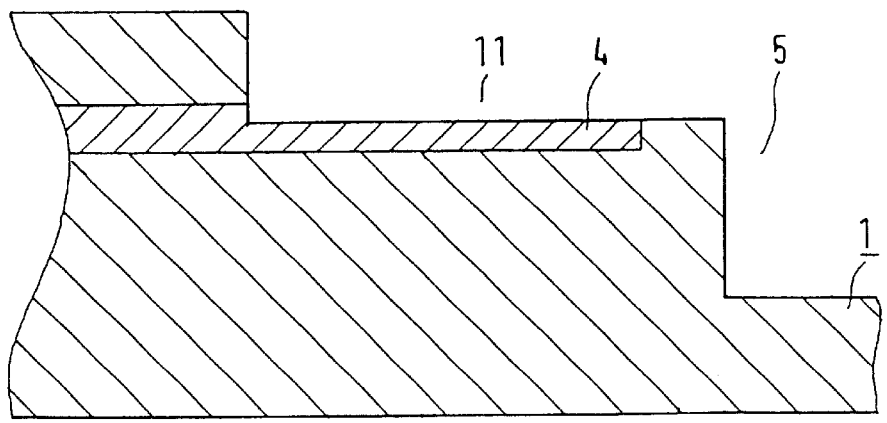
FIGS. 8 to 12 show enlarged details of different embodiments of the inventive data carrier after exposure of the antenna terminals in sectional views.

FIG. 8 shows a variant in which depression 11 extends over the total surface of the first step of two-step gap 5. In other words, terminal 4 of coil element 3 is exposed and partly removed upon production of two-step gap 5. In this variant one thus dispenses with the additional working step for producing depression 11.

Figure 9:
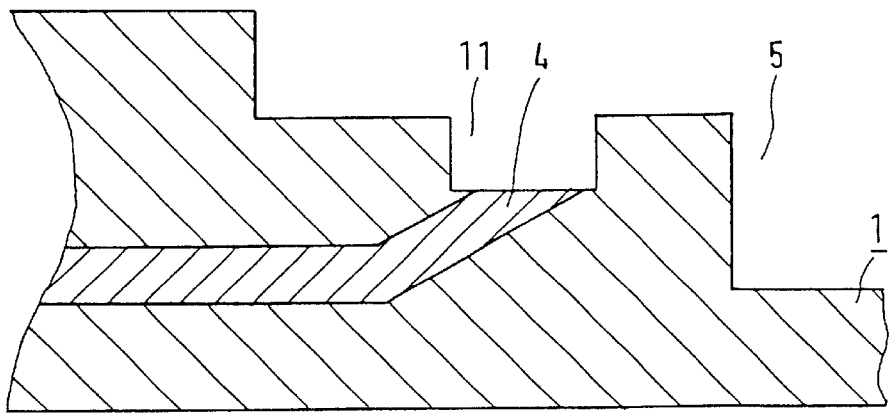

The embodiment shown in FIG. 9 corresponds with respect to depression 11 to the embodiment shown in FIGS. 3, 4 and 5. However, there is a difference in the geometric arrangement of terminal 4 of coil element 3. In contract to the embodiment according to FIGS. 3, 4 and 5, terminal 4 does not extend parallel to the card surface in the embodiment shown in FIG. 13 but on a slant at a presettable angle. This measure means that the depth of depression 11 can be varied within relatively wide limits while nevertheless ensuring that terminal 4 forms at least a partial surface of the bottom of depression 11 so as to permit contacting of terminal 4. This measure makes it possible, depending on the exact value of the angle formed by terminal 4 with the surface of card body 1, to permit a tolerance range for the depth of depression 11 which can be clearly greater than the thickness of terminal 4. In addition, it is possible not to fully exploit the permissible tolerance range for depression 11 and instead permit a certain tolerance for the exact position of terminal 4 relative to the card surface, thereby facilitating production of card body 1.

Figure 10:
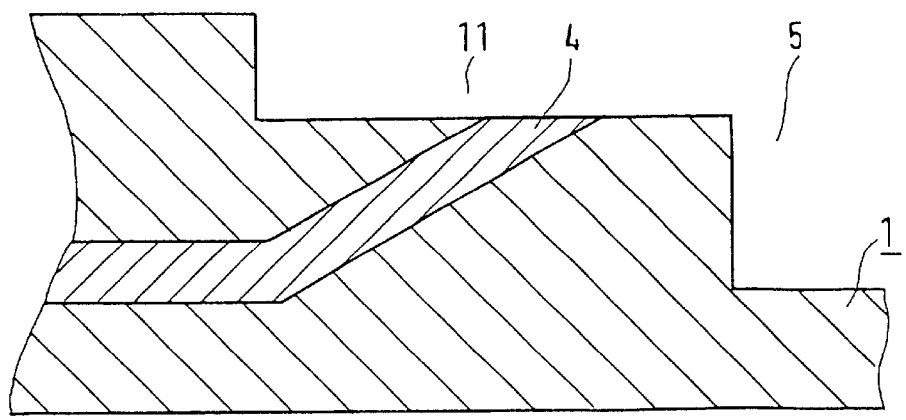

FIG. 10 also shows an embodiment with slanted terminal 4. The geometry and manner of production of depression 11 correspond to the embodiment according to FIG. 12, i.e. depression 11 extends over the total area of the first step of two-step gap 5.

Figure 11:
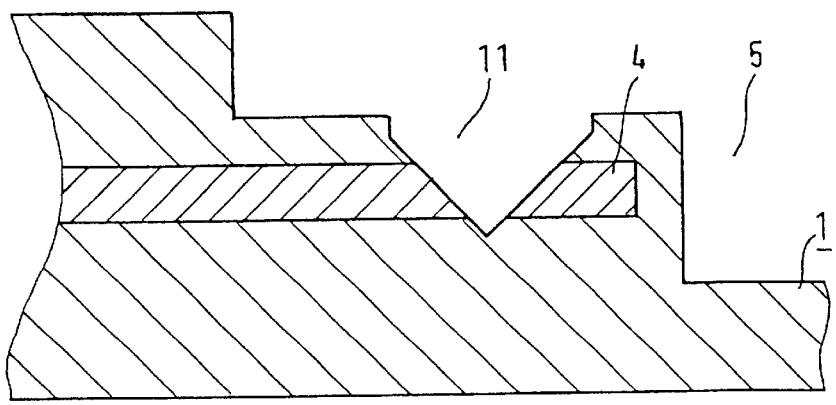

As shown in detail in FIG. 11, the effects caused by slanted terminal 4 can be achieved in similar fashion by suitable material removal. In this embodiment terminal 4 extends roughly parallel to the surface of card body 1. Material removal is done in such a way that terminal 4 is beveled at a presettable angle. This can be obtained for example by using a tapered milling tool and thus producing conical depression 11. Even if depression 11 protrudes on its bottom partly beyond terminal 4, terminal 4 still forms a partial area of the wall of depression 11, so that electric contacting of coil element 3 is ensured.

Figure 12:
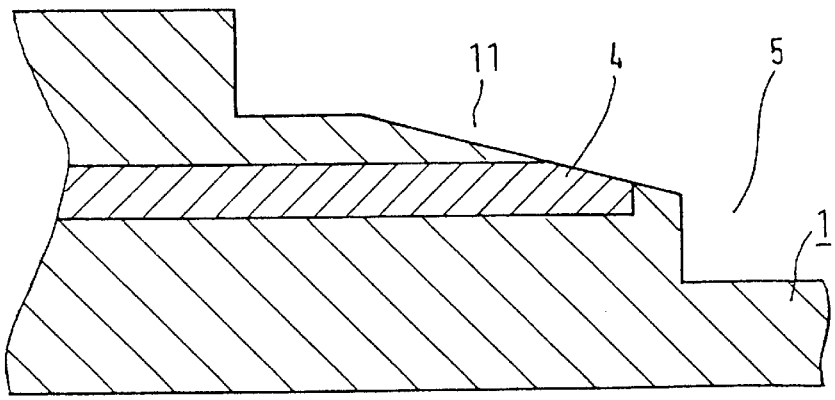

Fig. 12 shows a further embodiment for beveled terminal 4. The geometry according to FIG. 12 can be obtained for example by using a milling tool in a feed direction not extending perpendicular to the surface of card body 1.

Figure 13:
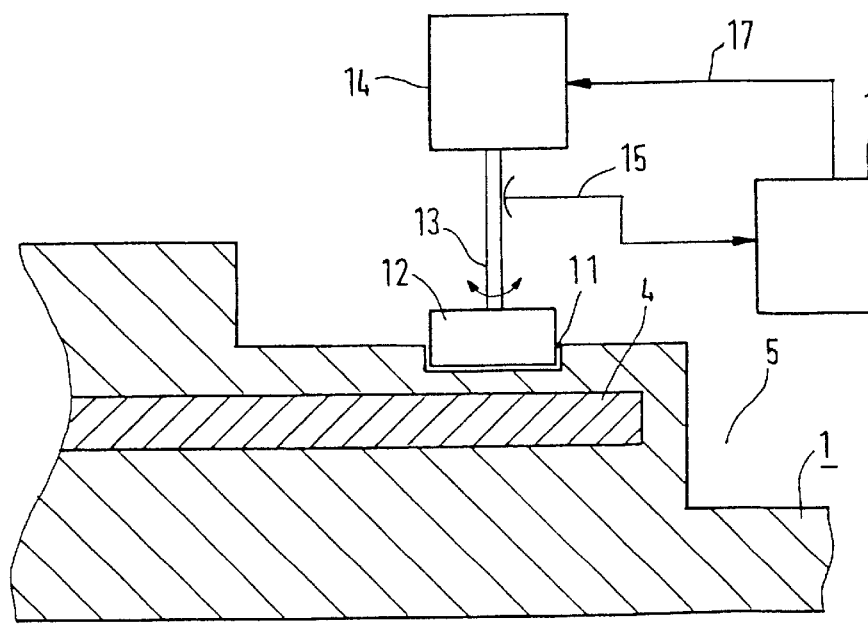
FIG. 13 shows an arrangement permitting very precise exposure of the antenna terminals in a sectional view.

FIG. 13 shows a sectional view of an arrangement permitting very precise exposure of terminals 4 of coil element 3. Exposure is done with the aid of milling tool 12 which is set rotating by drive 14 via shaft 13 and can be shifted laterally in the direction of shaft 13. Milling tool 12 and shaft 13 are made of electroconductive material and interconnected electrically. Shaft 13 is provided with tap 15 which can tap electric signals on the shaft and passes them on to evaluation electronics 16. Evaluation electronics 16 controls drive 14 via one or more lines 17. Evaluation electronics 16 is constructed so as to be able to act with a signal upon coil element 3 and thus terminals 4. This can be done with the aid of an electromagnetic field for example. As long as card material, which is normally an electric insulator, is located between milling tool 12 and terminal 4 of coil element 3 so that no electric contact yet exists between milling tool 12 and terminal 4, the signal cannot be tapped (or only in attenuated or modified form) on shaft 13 by tap 15. As soon as milling tool 12 has exposed terminal 4 and touches it, the signal tapped on shaft 13 changes. This change is detected by evaluation electronics 16 and can be used for controlling drive 14. Thus, a presettable feed can be moved as of the signal change, for example, in order to remove the uppermost layers of terminal 4.

With the arrangement shown in FIG. 13 one can very precisely compensate production-related dispersions of the position of terminals 4 of coil element 3 since each position is detected by measurement technology. Further, the arrangement makes it unnecessary to exactly position milling tool 12 relative to the card surface since positioning is uncritical for feed control, the feed being controlled with reference to the signal tapped from shaft 13.

The inventive method and card structure can also be used for a so-called hybrid card which can exchange data with an external device both via a contacting coupling and via a contactless coupling. In this case chip module 2 has suitable contact surfaces for contacting coupling.

In a variant of the invention one does without the use of chip module 2 as a carrier for integrated circuit 10. Instead, integrated circuit 10 is inserted directly into an accordingly shaped gap in card body 1. For the electric connection with terminals 4 of coil element 3 suitable contacts are provided on integrated circuit 10.

What is claimed is:

1. A method for producing a card-shaped data carrier comprising the steps of.
    providing a chip module (2) having an integrated circuit (10), and a card body (1) in which an antenna (3) is embedded at least partly; and
    exposing terminals (4) of the antenna (3) by removing superjacent card material, and
    removing material forming the terminals (4) to produce a bevel on the terminals.

2. A method according to claim 1, wherein card material removal step includes removal of material on the terminals (4) such that a bevel on the terminals is produced.

3. A method according to claim 2, wherein angle at which the terminals (4) are cut is preset by using a tapered milling tool.

4. A method according to claim 2, wherein an angle at which the terminals (4) are cut is preset by an arrangement of the terminals (4) in the card body (1), and the terminals (4) are slanted relative to a surface of the card body (1).

5. A method according to claim 1, wherein a given material removal is effected to expose the terminals (4).

6. A method for producing a card-shaped data carrier comprising the steps of:
    providing a chip module (2) having an integrated circuit (10), and a card body (1) in which an antenna (3) is embedded at least partly; and
    exposing terminals (4) of the antenna (3) by removing superjacent card material, wherein the superjacent card material removal for exposing the terminals (4) is controlled with an aid of a sensor signal, which is taken from said terminals (4).

7. A method according to claim 6, wherein the sensor signal changes as soon as a material-removing tool (12) touches the terminals (4).

8. A method according to claim 7, wherein a material-removing tool (12) is moved on by a presettable value after touching the terminals (4).

9. A method according to claim 1, wherein a material removal is effected with the aid of a milling tool (12).

10. A method according to claim 1, wherein an exposed terminals (4) are connected with the chip module (2) by means of a conductive adhesive (7).

11. A method according to claim 1, wherein the exposed terminals (4) are connected with the chip module (2) by mechanical contact of electroconductive areas (19) of the chip module (2).

12. A method according to claim 1, wherein an exposed terminals (4) are connected with the chip module (2) by welding.

13. A card-shaped data carrier comprising:
a card body (1) in which an antenna (3) is at least partly embedded therein, and
a chip module (2) having an integrated circuit (10), said module being inserted into a gap in the card body (10) and an electrical connection between the chip module (2) and the antenna (3) being established,
wherein the electric connection between chip module (2) and antenna (3) is effected via mechanical contact between electroconductive areas (19) of the chip module (2) and predetermined depressions (11) defined along terminals (4) of the antenna (3).

14. A data carrier according to claim 13, wherein the chip module (2) is electrically connected with the terminals (4) of the antenna (3) by means of a conductive adhesive (7), and the chip module (2) is fixed on the card body (1) by means of a further adhesive (6), which effects a mechanical connection between the chip module and the card body.

15. A data carrier according to claim 13, wherein the chip module (2) is electrically connected with the antenna (3) by mechanical contact between electroconductive areas (19) of the chip module (2) and the terminals (4) of the antenna (3).

16. A data carrier according to claim 13, wherein the chip module (2) is welded to the terminals (4) of the antenna (3).

17. A data carrier according to claim 14, wherein both the electric connection between chip module (2) and terminals (4) of the antenna (3) and a mechanical fixation of the chip module (2) on the card body (1) are realized by means of one and the same conductive adhesive (7).

18. A data carrier according to claim 14, wherein the conductive adhesive (7) comprises a thermally activable adhesive foil which is continuously conductive in directions perpendicular to its surface and only locally conductive in directions parallel to its surface.

19. A method according to claim 2, wherein an angle at which the terminals (4) are cut is preset by using a milling tool in a feed direction extending obliquely with regard to the card surface.

* * * * *